United States Patent
Spisak

(10) Patent No.: US 7,940,813 B2
(45) Date of Patent: May 10, 2011

(54) DEMULTIPLEXING DIGITAL DATA INTO A 3X MODE

(75) Inventor: Kevin C. Spisak, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 539 days.

(21) Appl. No.: 11/749,618

(22) Filed: May 16, 2007

(65) Prior Publication Data

US 2007/0274352 A1    Nov. 29, 2007

Related U.S. Application Data

(60) Provisional application No. 60/808,325, filed on May 24, 2006.

(51) Int. Cl.
*H04J 3/04* (2006.01)
(52) U.S. Cl. .......................................... 370/535
(58) Field of Classification Search .................. 370/536, 370/542, 535, 537, 539
See application file for complete search history.

(56) References Cited

U.S. PATENT DOCUMENTS 6,628,679 B1 * 9/2003 Talarek .......................... 370/536
7,440,475 B2 * 10/2008 Kubo et al. .................... 370/535

* cited by examiner

*Primary Examiner* — Kwang B Yao
*Assistant Examiner* — Anh Ngoc Nguyen
(74) *Attorney, Agent, or Firm* — Francis I. Gray; Thomas F. Lenihan

(57) ABSTRACT

An apparatus and method for demultiplexing sampled data at a first data rate on a data line using a non-standard demultiplex mode is achieved by first demultiplexing the sampled data using a standard, factor of two, demultiplex mode, to produce n data lines at 1/n time the first data rate, and then down-converting n data lines to m data lines at 1/m times the first data rate to produce the non-standard demultiplex mode. As a specific example sampled data is demultiplexed using a standard 4× mode and then converted to a non-standard 3× mode.

6 Claims, 2 Drawing Sheets

DEMULTIPLEXING DIGITAL DATA INTO A 3X MODE

BACKGROUND OF THE INVENTION

The present invention relates to demultiplexing digital data from multiple input channels, and more particularly for demultiplexing digital data in a non-standard mode that is not a factor of two, such as a 3× mode.

Measurement instruments, such as logic analyzers, have standard demultiplex modes, such as 2× and 4× (factors of two) modes for multiple input channels. The 2× demultiplex mode uses only one-half of the instrument input channels, but doubles the speed and memory length of data acquisition. The 4× mode uses only one-quarter of the instrument input channels, but gets four times the speed and memory depth. These modes allow the measurement instruments to operate faster without increasing system and memory bandwidth.

However sometimes a system under test (SUT) is too fast for the 2× mode and too wide for the 4× mode, but has a bandwidth that is less than that of the measurement instrument. For example if a logic analyzer has 288 input data channels with an 800 Mb/s system clock, the logic analyzer bandwidth is 230 Gb/s. In 2× mode there are 144 input data channels with an equivalent data rate of 1.6 Gb/s, while in the 4× mode there are 72 input data channels with an equivalent data rate of 3.2 Gb/s. However if the system under test has 96 data channels with a data rate of 2 Gb/s for a bandwidth of 192 Gb/s (less than the instrument bandwidth of 230 Gb/s), the 2× mode is too slow (rate of 1.6 Gb/s is less than SUT rate of 2 Gb/s) and the 4× mode is not wide enough (only 72 input data channels where 96 are required). Therefore an intermediate mode between 2× and 4× may make the measurement instrument operate most efficiently.

Therefore what is desired is a non-standard demultiplex mode for a measurement instrument between standard, factor of two, demultiplex modes, such as a 3× mode between 2× and 4× modes.

BRIEF SUMMARY OF THE INVENTION

Accordingly the present invention provides a non-standard demultiplex mode between standard, factor of two demultiplex modes, such as a 3× mode between standard 4× and 2× demultiplex modes. Each line of sampled data at a first data rate is demultiplexed using a standard, factor of two, demultiplex mode to produce n data lines at 1/n times the first data rate. Then each set of the n data lines are converted to m data lines at 1/m time the first data rate to produce the non-standard demultiplex mode. A standard clocking circuit produces the sets of n data lines, and a conversion circuit converts the n data lines to the m data lines where m is an integer less than n. The conversion circuit has three sets of registers and a set of multiplexers. An input set of registers receives each set of the n data lines and provides n output lines at a system clock rate. An intermediate set of registers receives n−1 of the n output lines and provides n−1 output lines at the system clock rate. The outputs of the input and intermediate sets of registers are input to the n inputs of each of m multiplexers so that for each system clock cycle one set of the multiplexer inputs are selected to be output on the m data lines. For a specific example n=4 and m=3 to produce the non-standard 3× demultiplex mode.

The objects, advantages and other novel features of the present invention are apparent from the following detailed description when read in conjunction with the appended claims and attached drawing.

DETAILED DESCRIPTION OF THE INVENTION

In a traditional logic analyzer a plurality of input signal channels together with a clock channel are acquired from a system under test (SUT) using known oversampling techniques. The oversampling techniques find SUT clock edges in the clock channel so that the instrument system clock may be delayed appropriately to sample the data contained in the input signals. The result is digital data derived from the input signals. Depending upon the relative bandwidths, clock speeds and data channels between the logic analyzer and the SUT, the input channels represented by the acquired data are demultiplexed so the system clock of the logic analyzer extracts the data values for each clock of the SUT. The basic concept is to demultiplex the acquired data channels by using a standard, factor of two, higher order demultiplex mode than required, and then convert from the higher order demultiplex mode to a desired, lower, non-standard demultiplex mode between standard, factor of two, demultiplex modes. For ease of illustration the following description relates to the generation of a 3× demultiplex mode which is intermediate to standard 2× and 4× demultiplex modes. Such a non-standard demultiplex mode is not currently available in any known measurement instrument.

Figure 1:
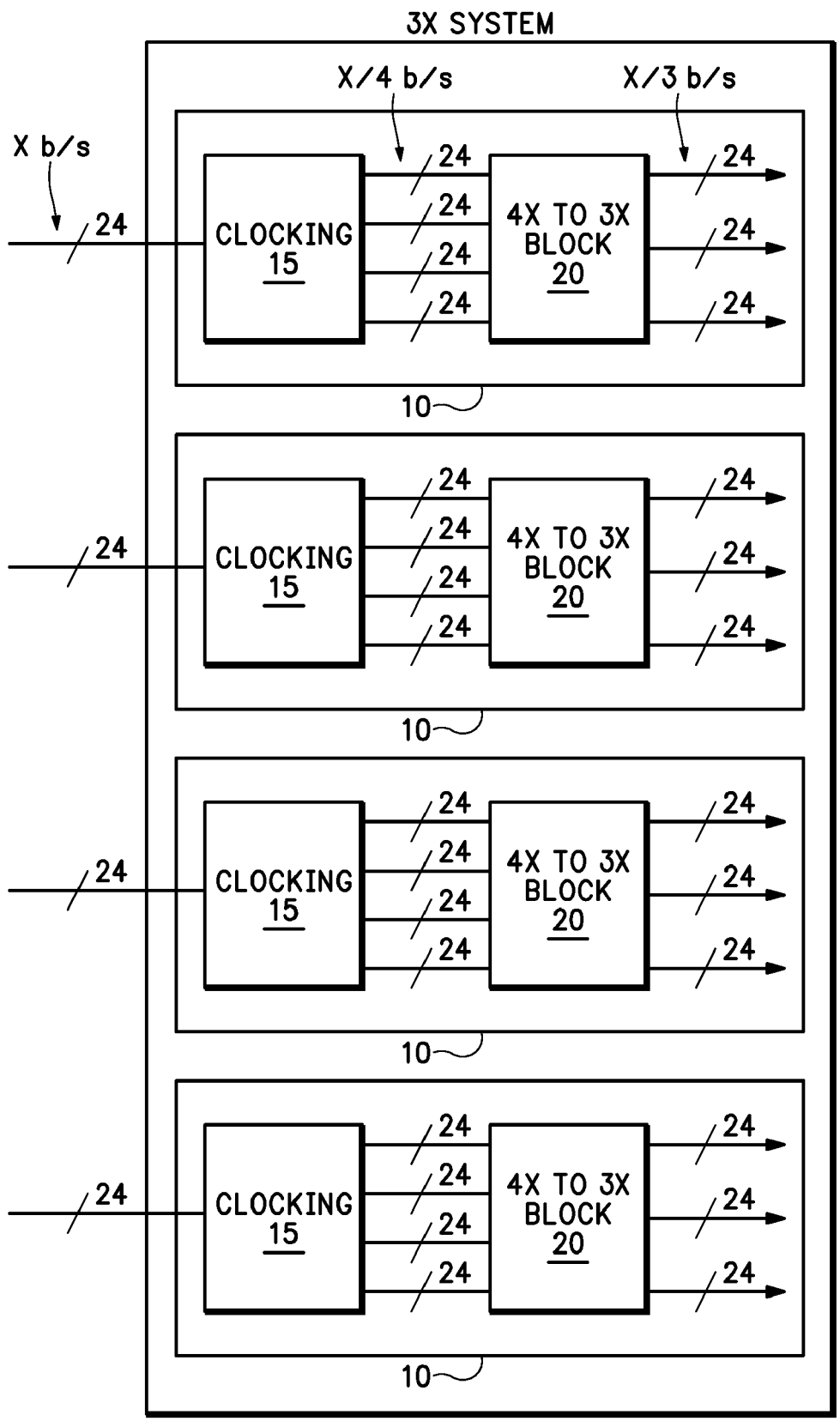
FIG. 1 is a block diagram view of an illustrative system for a 3× demultiplexing mode according to the present invention.
Figures 2, 3:
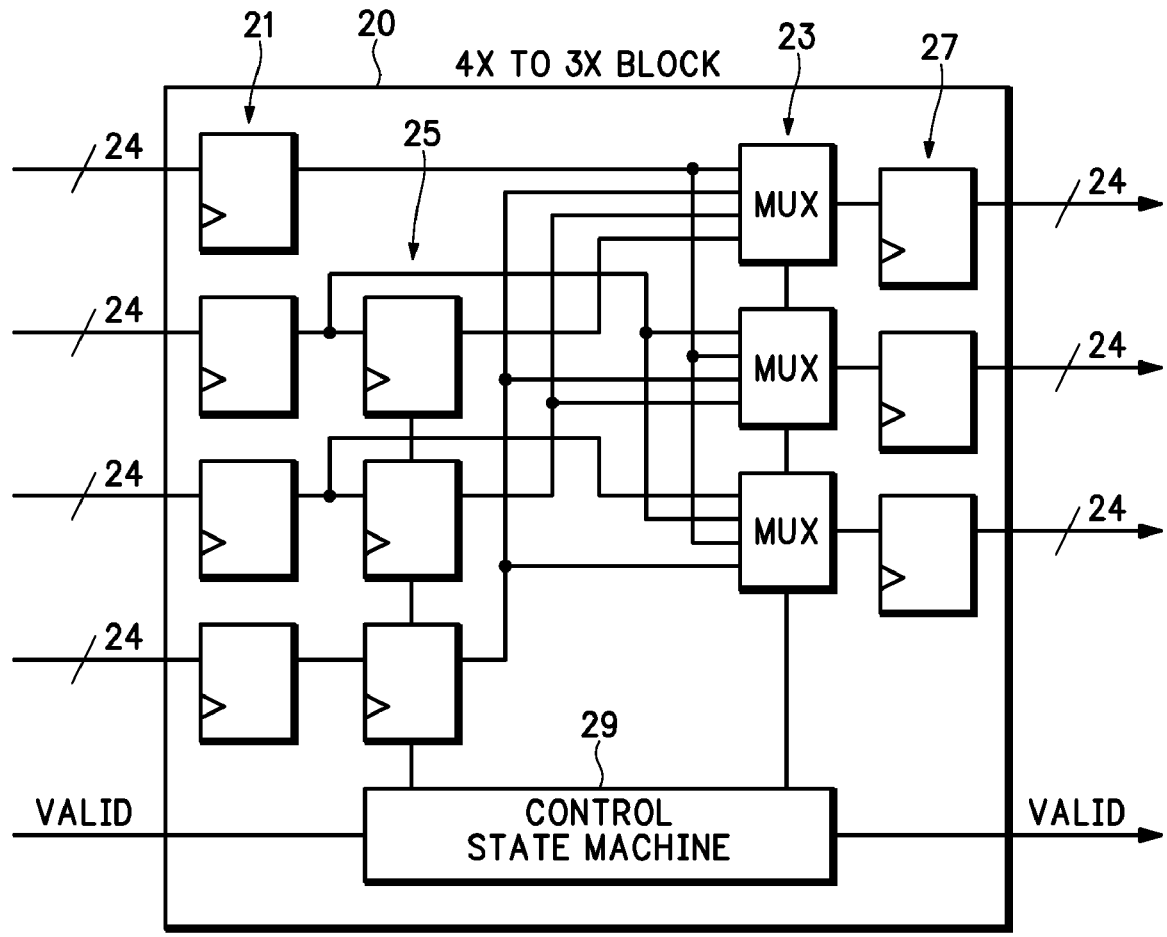
FIG. 2 is a table view illustrating a conversion from a 4× demultiplexing mode to a 3× demultiplexing mode according to the present invention.
FIG. 3 is a block diagram view of a 4× to 3× conversion block for the system of FIG. 1 according to the present invention.

Referring now to FIG. 1 four modules 10 are shown having a total of 96 data input lines, each module having 24 data input lines and 72 (3×) data output lines. The data on each input line represents acquired digital data having a data rate of X b/s. The data from each input line is taken four bits at a time by a clocking circuit 15 to produce four output data lines each having a data rate of (X/4) b/s, i.e., a standard 4× demultiplex mode. The output data lines from the clocking circuit 15 are input to a 4×3 converter block 20 to produce for each four of the data lines input to the converter block three data lines output from the converter block, each output data line from the converter block having a data rate of (X/3) b/s. Taking the instrument system clock in groups of four consecutive clock cycles, as shown in FIG. 2, for each of the first three system clock cycles four bits of data output from the clocking circuit 15 representing one of the input data lines are input to the converter block 20, and on the fourth system clock cycle no data is transferred to the converter block. Likewise for each of the four system clock cycles three bits are clocked out from the converter block 20 to produce the 4×3 conversion.

The converter block 20 is shown in greater detail in FIG. 3 which also shows a parallel architecture as shown in FIG. 1. However the following description is related to a single input data line, which is replicated for each of the other data lines. At the first system clock cycle four data samples are loaded into a first set 21 of four registers. The output of the first of the first set 21 of registers is coupled directly to three multiplexers 23, while the output from the second of the first set of registers is coupled directly to the second and third ones of the three multiplexers and to one of a second set 25 of three registers, the output from the third of the first set of registers is coupled directly to the third of the three multiplexers and to a second one of the second set of registers, and the output from the fourth of the first set of registers is coupled to a third one of the second set of registers. The outputs from the second set 25 of registers are input respectively to the first one of the three multiplexers 23, to the first and second ones of the three multiplexers, and to the three multiplexers. The outputs from the multiplexers 23 are clocked into an output set 27 of three registers. A control circuit 29 controls the switching of the multiplexers 23 and resetting of the second set 25 of registers.

On the first system clock cycle four data samples are loaded into the first set 21 of registers—ABCD—and the first three—ABC—are passed directly to the three multiplexers 23 which in turn pass them to the output set 27 of registers. On the next system clock cycle the next four data samples are loaded into the first set 21 of registers—EFGH—and the output from the fourth of the first set of registers—D—is passed to the third of the second set 25 of registers. The three multiplexers 23 select the output from the third of the second set 25 of registers and the first two of the first set 21 of registers—DEF—to provide the next output loaded into the output set 27 of registers. On the third system clock cycle the next four data samples—IJKL—are loaded into the first set 21 of registers and the contents of the third and fourth ones of the first set of registers are loaded into the second and third ones of the second set 25 of registers—GH. The multiplexers 23 select the outputs from the second and third ones of the second set 25 of registers and the first one of the first set 21 of registers—GHI—to produce the next output loaded into the output set 27 of registers. On the fourth system clock cycle the first set 21 of registers is idle and the outputs from the second, third and fourth ones of the first set of registers are transferred to the second set 25 of registers, which in turn are selected by the multiplexers 23 to produce the next output—JKL—which is loaded into the output set 27 of registers. The cycle then repeats for the next set of four system clock cycles until all the acquired data is processed for that input data channel.

In other words the first one of the multiplexers 23 selects on sequential system clocks the output from the first one of the first set 21 of registers, the output from the third one of the second set 25 of registers, the output from the second one of the second set of registers and the output from the third one of the second set of registers. The second one of the multiplexers 23 selects on sequential system clock cycles the output from the second one of the first set 21 of registers, the output form the first one of the first set of registers, the output from the third one of the second set 25 of registers and the output from the second one of the third set of registers. Finally the third one of the multiplexers 23 selects on sequential system clock cycles the output from the third one of the first set 21 of registers, the output from the second one of the first set of registers, the output from the first one of the first set of registers and the output from the third one of the second set 25 of registers.

Although described as 3× demultiplex mode that converts a 4× demultiplex mode into the 3× demultiplex mode, for other non-standard demultiplexer modes the principal is similar. Perform a standard demultiplex with a higher factor of two multiple than required, and then convert to the lower desired non-standard multiple using an appropriate number of multiplexers 23 and of registers in each of the first, second and output sets 21, 25, 27. For example for a 5× demultiplex mode perform a standard 8× demultiplex and perform an 8×5 conversion with five multiplexers 23 and five registers in the output set 27, seven registers in the second set 25 and eight registers in the first set 21. The number of system clock cycles before the cycle repeats is eight.

Thus the present invention provides a method of providing a non-standard demultiplex mode that is other than a factor of two by first performing a standard, factor of two, demultiplex mode with a multiple greater than that desired, and then converting from the higher multiple to the desired non-standard multiple to produce the non-standard demultiplex mode.

What is claimed is:

1. An apparatus for demultiplexing sampled data at a first data rate on a data line using a non-standard demultiplex mode comprising:

means for demultiplexing the sampled data on the data line using a standard, factor of two, demultiplex mode to produce n data lines of sampled data at 1/n times the first data rate; and means for converting the n lines of sampled data to m data lines of sampled data at 1/m times the first data rate to produce the non-standard demultiplex mode, m being an integer less than n; wherein the converting means comprises:

means for clocking the sampled data from the n data lines through a first set of n registers at a system clock rate to produce n first output lines;

means for clocking the sampled data from n−1 of the n first output lines through a second set of n−1 registers at the system clock rate to produce n−1 second output lines; and means for multiplexing the sampled data from the first and second output lines to produce the m data lines of sampled data.

2. The apparatus as recited in claim 1 wherein n=4 and m=3 to produce the non-standard demultiplex mode as a 3× mode.

3. The apparatus as recited in claim 2 wherein the first clocking means comprises a first set of four registers, each having a data input coupled to a separate one of the four data lines, having a clock input to which the system clock is applied, and having an output coupled to a separate one of the first output lines.

4. The apparatus as recited in claim 3 wherein the second clocking means comprises a second set of three registers, each having a data input coupled to a separate one of three of the first output lines, having a clock input to which the system clock is applied, and having an output coupled to a separate one of the second output lines.

5. The apparatus as recited in claim 4 wherein the multiplexing means comprises three multiplexers, each having four inputs and an output, the inputs of the multiplexers being coupled to the first and second output lines as follows—the output from a first one of the first set of registers being coupled respectively to a first input of a first one of the multiplexers, a second input of a second one of the multiplexers and a third input of a third one of the multiplexers; the output from a second one of the first set of registers being coupled to a first input of the second one of the multiplexers, a second input of the third one of the multiplexers, the data input of a first one of the second set of registers; the output from a third one of the first set of registers being coupled to a first input of the third one of the multiplexers, the data input of a second one of the second set of registers; the output from a fourth one of the first set of registers being coupled to the input of a third one of the second set of registers; the output from the first one of the second set of registers being coupled to a fourth input of the first one of the multiplexers; the output from the second one of the second set of registers being coupled to a third input of the first one of the multiplexers and to a fourth input of the second one of the multiplexers; and the output of the third one of the second set of registers being coupled to a second input of the first one of the multiplexers, to a third input of the second one of the multiplexers and to a fourth input of the third one of the multiplexers.

6. The apparatus as recited in claim 5 wherein the multiplexing means further comprises an output set of three registers, each having a data input coupled to a separate one of the outputs of the multiplexers, having a clock input to which the system clock is applied, and having an output coupled to a separate one of the three data lines.

* * * * *